(12) United States Patent
Ofuji et al.

(10) Patent No.: US 8,084,331 B2
(45) Date of Patent: Dec. 27, 2011

(54) METHOD OF TREATING SEMICONDUCTOR ELEMENT

(75) Inventors: Masato Ofuji, Kawasaki (JP); Katsumi Abe, Kawasaki (JP); Hisae Shimizu, Tokyo (JP); Ryo Hayashi, Yokohama (JP); Masafumi Sano, Yokohama (JP); Hideya Kumomi, Tokyo (JP); Yasuyoshi Takai, Kawasaki (JP); Takehiko Kawasaki, Kamakura (JP); Norio Kaneko, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/865,032

(22) PCT Filed: Mar. 2, 2009

(86) PCT No.: PCT/JP2009/054355
§ 371 (c)(1),
(2), (4) Date: Jul. 28, 2010

(87) PCT Pub. No.: WO2009/110623
PCT Pub. Date: Sep. 11, 2009

(65) Prior Publication Data
US 2011/0092016 A1    Apr. 21, 2011

(30) Foreign Application Priority Data

Mar. 6, 2008 (JP) .................................. 2008-056284

(51) Int. Cl.
*H01L 21/331* (2006.01)
(52) U.S. Cl. ........ 438/378; 438/197; 438/308; 438/473; 438/535
(58) Field of Classification Search .................. 438/308, 438/378, 473, 535
See application file for complete search history.

(56) References Cited

U.S. PATENT DOCUMENTS 5,481,124 A    1/1996 Kozuka et al. ................ 257/185
(Continued)

FOREIGN PATENT DOCUMENTS

| JP | 10-209460 | 8/1998 |
|----|-----------|--------|
| JP | 10-209460 A | 8/1998 |

OTHER PUBLICATIONS

H. Yabuta, et al., "High-mobility thin-film transistor with amorphous InGaZnO$_4$ channel fabricated by room temperature rf-magnetron sputtering," Applied Physics Letters, vol. 89, pp. 112123-1-112123-3, Sep. 14, 2006.

(Continued)

*Primary Examiner* — Dung A. Le
(74) *Attorney, Agent, or Firm* — Fitzpatrick, Cella, Harper & Scinto

(57) ABSTRACT

In a method of treating a semiconductor element which at least includes a semiconductor, a threshold voltage of the semiconductor element is changed by irradiating the semiconductor with light with a wavelength longer than an absorption edge wavelength of the semiconductor. The areal density of in-gap states in the semiconductor is $10^{13}$ cm$^{-2}$eV$^{-1}$ or less. The band gap may be 2 eV or greater. The semiconductor may include at least one selected from the group consisting of In, Ga, Zn and Sn. The semiconductor may be one selected from the group consisting of amorphous In—Ga—Zn—O (IGZO), amorphous In—Zn—O (IZO) and amorphous Zn—Sn—O (ZTO). The light irradiation may induce the threshold voltage shift in the semiconductor element, the shift being of the opposite sign to the threshold voltage shift caused by manufacturing process history, time-dependent change, electrical stress or thermal stress.

15 Claims, 9 Drawing Sheets

U.S. PATENT DOCUMENTS

| | | | | |
|---|---|---|---|---|
| 5,589,708 | A * | 12/1996 | Kalnitsky | 257/646 |
| 7,411,209 | B2 | 8/2008 | Endo et al. | 257/43 |
| 7,534,628 | B2 | 5/2009 | Takai et al. | 438/5 |
| 2009/0065771 | A1 | 3/2009 | Iwasaki et al. | 257/43 |
| 2009/0072232 | A1 | 3/2009 | Hayashi et al. | 257/43 |
| 2010/0044703 | A1 | 2/2010 | Yabuta et al. | 257/43 |
| 2010/0053041 | A1 | 3/2010 | Abe et al. | 345/76 |
| 2010/0059751 | A1 | 3/2010 | Takahashi et al. | 257/57 |
| 2010/0085081 | A1 | 4/2010 | Ofuji et al. | 326/102 |
| 2010/0117072 | A1 | 5/2010 | Ofuji et al. | 257/43 |
| 2010/0194450 | A1 | 8/2010 | Shimizu et al. | 327/109 |
| 2010/0203673 | A1 | 8/2010 | Hayashi et al. | 438/104 |
| 2010/0244022 | A1 | 9/2010 | Takahashi et al. | 257/43 |

OTHER PUBLICATIONS

P. Barquinha et al., "Effect of UV and visible light radiation on the electrical performances of transparent TFTs based on amorphous indium zinc oxide," Journal of Non-Crystalline Solids, vol. 352, pp. 1756-1760, Apr. 18, 2006.

C.J. Kim, et al., "Highly Stable $Ga_2O_3$-$In_2O_3$-ZnO TFT for Active-Matrix Organic Light-Emitting Diode Display Application," IEEE Proceedings of the 2006 International Electron Devices Meeting (IEDM).

T. Riedl, et al., "Ultra-high long-term stability of oxide-TTFTs under current stress," Phys. Stat. Sol. (Rapid Research Letters), vol. 1, No. 5, pp. 175-177, Jul. 27, 2007.

P. Görrn, et al., "The influence of visible light on transparent zinc tin oxide thin film transistors," Applied Physics Letters, vol. 91, pp. 193504-1-193504-3, Nov. 6, 2007.

P. Görrn, et al., "Stability of transparent zinc tin oxide transistors under bias stress," Applied Physics Letters, vol. 90, pp. 063502-1-063502-3, Feb. 5, 2007.

* cited by examiner

| CONDITION | | $V_{th}/V$ | $\mu_{sat}/cm^2V^{-1}s^{-1}$ | S/V dec$^{-1}$ |
|---|---|---|---|---|
| (1-1) | DARK PLACE | 4.9 | 12.8 | 0.6 |
| (1-2) | 400 nm, 0.2 mW cm$^{-2}$ | 0.5 | 12.3 | 0.6 |
| (1-3) | 500 nm, 0.2 mW cm$^{-2}$ | 3.1 | 12.5 | 0.6 |
| (1-4) | 320 nm, 0.2 mW cm$^{-2}$ | -9.5 | 17.9 | 3.3 |

| CONDITION | | $V_{th}/V$ | $\mu_{sat}/cm^2V^{-1}s^{-1}$ | S/V dec$^{-1}$ |
|---|---|---|---|---|
| (2-1) | TFT-A, DARK PLACE | 4.8 | 13.2 | 0.6 |
| (2-2) | TFT-B, DARK PLACE | 7.1 | 12.2 | 1.0 |
| (2-3) | TFT-B, 500 nm, 0.2 mW cm$^{-2}$ | 5.1 | 11.8 | 1.0 |

| CONDITION | | $V_{th}/V$ | $\mu_{sat}$ /cm$^2$V$^{-1}$s$^{-1}$ | S/V dec$^{-1}$ |
|---|---|---|---|---|
| (3-1) | IMMEDIATELY AFTER FABRICATION, DARK PLACE | 5.1 | 12.8 | 0.6 |
| (3-2) | HALF A YEAR AFTER FABRICATION, DARK PLACE | 8.2 | 12.6 | 0.6 |
| (3-3) | HALF A YEAR AFTER FABRICATION 500nm, 0.2 mW cm$^{-2}$ | 6.1 | 12.4 | 0.6 |

FIG. 15

| CONDITION | | $V_{th}/V$ | $\mu_{sat}/cm^2V^{-1}s^{-1}$ | $S/V\ dec^{-1}$ |
|---|---|---|---|---|
| (6-1) | DARK PLACE (BEFORE LIGHT-IRRADIATION) | 4.0 | 11.8 | 0.6 |
| (6-2) | DARK PLACE (AFTER IRRADIATION OF 400nm, 0.2 mW cm$^{-2}$) | 2.5 | 11.6 | 0.6 |
| (6-3) | DARK PLACE (AFTER APPLICATION OF Vds = +20 V, Vgs = +20 V 3600 s) | 3.5 | 12.0 | 0.6 |

FIG. 16

| CONDITION | | $V_{th}/V$ | $\mu_{sat}/cm^2V^{-1}s^{-1}$ | $S/V\ dec^{-1}$ |
|---|---|---|---|---|
| (7-1) | DARK PLACE (BEFORE LIGHT-IRRADIATION) | 4.0 | 13.0 | 0.6 |
| (7-2) | DARK PLACE (AFTER HEATING AT 200°C FOR 15 MIN. IN ATMOSPHERE) | 11.0 | 12.1 | 0.7 |
| (7-3) | DARK PLACE (AFTER IRRADIATION OF 400nm, 0.2 mW cm$^{-2}$) | 7.3 | 11.9 | 0.7 |

FIG. 17

| CONDITION | | $V_{th}/V$ | $I_{on}/10^{-5}$ A | $\Delta I_{on}/I_{on}$ |
|---|---|---|---|---|
| (8-1a) | DARK PLACE (WITHOUT ELECTRIC STRESS) | 5.0 | 1.50 | 4.1% |
| (8-1b) | DARK PLACE (AFTER APPLICATION OF Vds = +0.1 V, Vgs = +20 V 100 s) | 5.1 | 1.44 | |
| (8-2a) | 400nm, 0.2 mW cm$^{-2}$ | 0 | 6.00 | 2.0% |
| (8-2b) | 400nm, 0.2 mW cm$^{-2}$ | 0.1 | 5.88 | |

METHOD OF TREATING SEMICONDUCTOR ELEMENT

TECHNICAL FIELD

The present invention relates to a method of treating a semiconductor element. In particular, the present invention relates to a method of treating a semiconductor element using light irradiation.

BACKGROUND ART

Currently, with respect to a thin-film transistor (TFT), a wide variety of materials have been searched and considered for use as a channel layer, in an attempt to achieve high performance, low-temperature fabrication process, and low costs. From this perspective, possible materials for the channel layer may be, for example, amorphous silicon, polycrystal silicon, microcrystal silicon and organic semiconductor.

In recent years, as a potent material to be used as such channel layer, an oxide semiconductor has been studied actively. For example, Barquinha et al., J. Non-Cryst. Sol., 352, 1756 (2006) and Yabuta et al., Appl. Phys. Lett., 89, 112123 (2006) disclose methods of fabricating a TFT using an amorphous In—Zn—O (IZO) thin film and an amorphous In—Ga—Zn—O (IGZO) film, being oxide semiconductors for the channel layer.

The TFT will have a different threshold voltage depending on the semiconductor material, fabricating method, etc. of the channel layer. Moreover, the threshold voltage of the TFT will change due to various factors (e.g. manufacturing process history, time-dependent change, electrical stress, thermal stress, etc.). Here, electrical stress is a kind of stress that can be generated by voltage or current as applied to the semiconductor. Thermal stress is a kind of stress that can be generated by heat applied from outside on the semiconductor periphery, or Joule heating of the semiconductor. With the actual TFT, there are cases where such stresses may be applied simultaneously.

The above-mentioned oxide semiconductor TFT is not an exception. For example, Riedl et al., Phys. Stat. Sol., 1, 175 (2007) and Kim et al., International Electron Devices Meeting 2006 (IEDM '06), 11-13, 1 (2006) note that change in threshold voltage due to electrical stress or due to a combination of electric and thermal stresses has been observed. Moreover, with the oxide semiconductor TFT, the threshold voltage can change by irradiating the TFT with visible light and ultraviolet light, as mentioned in Barquinha et al., J. Non-Cryst. Sol., 352, 1756 (2006) and Gorrn et al., Appl. Phys. Lett., 91, 193504 (2007).

Furthermore, Japanese Patent Application Laid-Open No. H10-209460 discloses a method of decreasing the threshold voltage of the TFT, which uses polycrystal silicon as the material of the channel layer, by adopting a structure in that light will enter into the channel layer of the TFT.

DISCLOSURE OF THE INVENTION

However, none of the above-mentioned references discloses a method of compensating for or restraining the threshold voltage shift that can be caused by various factors, or a method of making the influence of such change in the threshold voltage relatively small.

When the threshold voltage shift is to be compensated for or restrained by some process, it is desirable that characteristics (e.g. charge mobility, sub-threshold swing (S value), etc. in a TFT) other than the threshold voltage are maintained at conditions equal to those before the process is performed. A unit that enables such purpose is not known either. For example, Japanese Patent Application Laid-Open No. H10-209460 notes that increase in mobility happens simultaneously with decrease in the threshold voltage. Moreover, Barquinha et al., J. Non-Cryst. Sol., 352, 1756 (2006) and Gorrn et al., Appl. Phys. Lett., 91, 193504 (2007) note that decrease in mobility happens simultaneously with decrease in the threshold voltage. Such behaviors are problematic in a case where a load such as an organic light-emitting diode is connected to the TFT and a current to be supplied to the load is to be controlled by a gate voltage of the TFT.

In view of the above-mentioned problems, it is an object of the present invention to provide a method of treating a semiconductor element which enables compensation or restraining of undesirable change in threshold voltage.

The present invention relates to a method of treating a semiconductor element which at least includes a semiconductor as one component thereof. The present invention is characterized in that a threshold voltage of the semiconductor element is changed by irradiating the semiconductor with light with a wavelength longer than an absorption edge wavelength of the semiconductor.

The present invention is directed to a method of treating a semiconductor element which at least includes a semiconductor, characterized in that a threshold voltage of the semiconductor element is shifted by irradiating the semiconductor with light with a wavelength longer than an absorption edge wavelength of the semiconductor.

The semiconductor can be shielded from light with a wavelength shorter than the absorption edge wavelength of the semiconductor.

The semiconductor can be shielded by a filter placed between a light source and the semiconductor.

The semiconductor element at least can include a gate electrode, a source electrode, a drain electrode, a channel layer and a gate insulating layer, while the semiconductor is the channel layer.

In the method of treating a semiconductor element, the areal density of in-gap states in the semiconductor can be $10^{13}$ $cm^{-2}eV^{-1}$ or less.

In the method of treating a semiconductor element, a band gap in the semiconductor can be 1.55 eV or greater.

The band gap can be 2 eV or greater.

The semiconductor can include at least one selected from the group consisting of In, Ga, Zn and Sn.

In the method of treating a semiconductor element, at least a part of the semiconductor can be amorphous.

The semiconductor can be one selected from the group consisting of amorphous In—Ga—Zn—O (IGZO), amorphous In—Zn—O (IZO) and amorphous Zn—Sn—O (ZTO).

The light irradiation can induce the threshold voltage shift in the semiconductor element, the shift being of the opposite sign to the threshold voltage shift caused by manufacturing process history, time-dependent change, electrical stress or thermal stress.

The amount of the threshold voltage shift by the light irradiation can be equal to the amount of the threshold voltage shift caused by manufacturing process history, time-dependent change, electrical stress or thermal stress.

The amount of the threshold voltage shift of the semiconductor element can be 50 or more times an amount of the threshold voltage shift caused by manufacturing process history, time-dependent change, electrical stress or thermal stress.

The light irradiation can be to be performed while the threshold voltage shift is occurring.

The light irradiation can be to be performed before or after the occurrence of the threshold voltage shift of the semiconductor element.

With the present invention, the threshold voltage of the semiconductor element can be changed, and the threshold voltage shift due to factors such as manufacturing process history, time-dependent change, electrical stress, thermal stress, etc. can be compensated for or restrained. Furthermore, in the semiconductor element where the threshold voltage can be changed by the factors such as manufacturing process history, time-dependent change, electrical stress, thermal stress, etc., influence of such change in the threshold voltage can be made relatively small. In addition, characteristics (e.g. charge mobility, S value, etc.) other than the threshold voltage can be maintained at conditions equal to those before the process is performed.

Further features of the present invention will become apparent from the following description of exemplary embodiments with reference to the attached drawings.

BRIEF DESCRIPTION OF THE DRAWING

FIG. 15 is a diagram illustrating TFT characteristics under each of certain conditions.

FIG. 16 is a diagram illustrating TFT characteristics under each of certain conditions.

FIG. 17 is a diagram illustrating Vth, Ion and ΔIon/Ion derived from the transfer characteristics measured under respective certain conditions.

BEST MODES FOR CARRYING OUT THE INVENTION

In the following, one exemplary embodiment of a method of treating a semiconductor element according to the present invention will be described with reference to the drawings.

Figure 1:
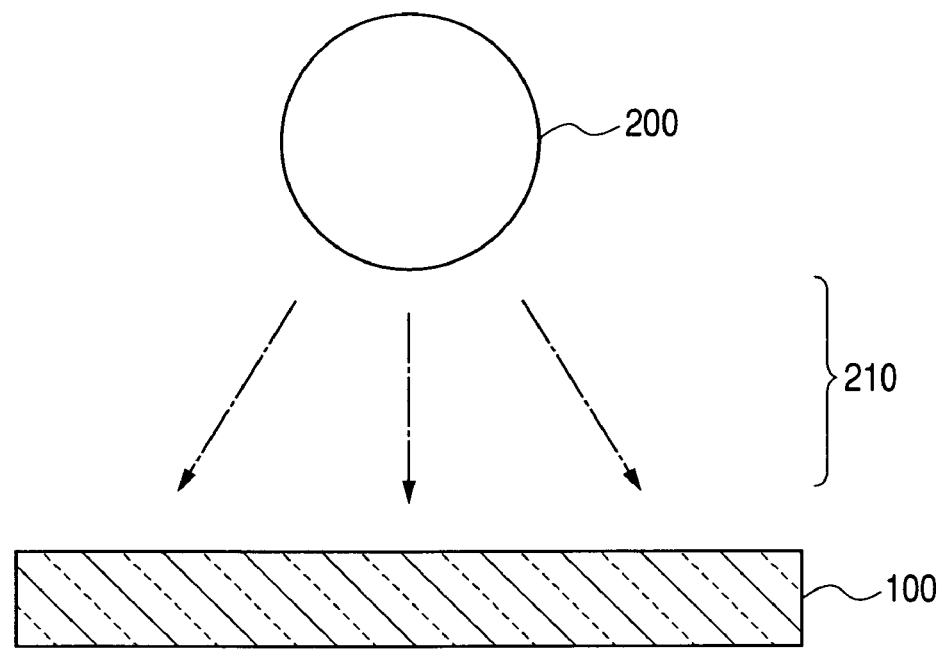
FIG. 1 is a schematic view illustrating an exemplary embodiment of a method of treating a semiconductor element according to the present invention.

FIG. 1 is a schematic view illustrating the exemplary embodiment of the treatment method according to the present invention. A semiconductor 100 (also referred to as semiconductor layer) and a light source 200 are arranged at appropriate positions, and light 210 will be emitted from the light source 200. As long as desired effects can be obtained, it is not necessary to have the semiconductor 100 and the light source 200 arranged in a facing arrangement as shown in the diagram.

The semiconductor 100 can have any shape. The semiconductor 100 can be a part of a semiconductor element comprising electrodes and other materials such as insulators. For example, the semiconductor 100 may be a semiconductor film (also referred as semiconductor thin film) which can be used as a channel layer of a TFT.

The light source 200 can have any shape. As the light source 200, a spontaneous light-emitting type such as a heat filament, discharge light-source, light-emitting diode can be used. Or else, environmental light such as solar light, light from indoor lighting can be used as the light source 200. Any of such light sources can have a controlling unit which control wavelength, irradiation intensity, and irradiation time.

In the structure of FIG. 1, the semiconductor 100 will be irradiated with the light 210 with a wavelength longer than an absorption edge wavelength (i.e. a wavelength of light with the lowest energy in terms of light absorption based on interband transition of free carriers in the semiconductor) of the semiconductor. Thereby, only the threshold voltage of the semiconductor element that uses the semiconductor as a component thereof can be changed. It can be considered that such change in the threshold voltage can be caused as fixed charges, such as carriers, trapped inside the semiconductor or in the vicinity of the semiconductor are released due to the light irradiation. Such light irradiation on the semiconductor can be performed while the semiconductor element is being formed, or after the semiconductor element has been formed.

In the case of performing the light irradiation while the semiconductor element is being formed, the semiconductor may be irradiated with light at any point of the manufacturing processes. In this case, however, it is better that the light irradiation is performed before a shielding material such as a metal electrode is applied on the semiconductor, considering that an irradiated area can be made larger that way.

In the case of performing the light irradiation after the semiconductor element has been formed, the semiconductor element of which the threshold voltage is changed can be of any form as long as the semiconductor element has a structure with which the light can reach the semiconductor. For instance, the semiconductor element can be a transistor such as a field effect transistor or a TFT having been formed using the semiconductor 100 as the channel layer. The TFT formed using the semiconductor 100 as the channel layer can be a TFT such as the one shown in FIG. 2 in which a gate insulating layer 311, a source electrode 321, a drain electrode 322, and a channel layer 330 are formed on a gate electrode 312. In the case of TFT of FIG. 2, the channel layer 330 being the semiconductor can be irradiated with the light 210 at an opening portion between the source electrode 321 and the drain electrode 322. As is obvious, the TFT applicable is not limited to the one as shown. When the semiconductor element is a TFT, change in transfer characteristics (Ids-Vgs characteristics where Ids is a drain-source current, and Vgs is a gate-source voltage) between before and after the light irradiation can be made practically equivalent to parallel shift along a Vgs axis, depending on conditions. That is, by selecting irradiation conditions with the light 210, the threshold voltage alone can be changed virtually without having electric field mobility and S value changed.

Moreover, the semiconductor element can be a Schottky junction element or a p-n junction element. The threshold voltage of the semiconductor element, for instance, can be defined as an applied voltage necessary for letting a predetermined forward current flow. The threshold voltage of the semiconductor element can also be defined as a breakdown voltage of a varistor that uses the junction elements as just mentioned. Or else, in a case when the p-n junction element is an element that emits light by current or voltage applied, the threshold voltage of the semiconductor element can be defined as a light emitting threshold voltage.

The exemplary embodiment of the present invention can also be applied to a semiconductor thin film. That is, with respect to the threshold voltage of the semiconductor element formed as having a semiconductor thin film to which an arbitrary structure is being added, the amount of change in the threshold voltage that can be induced by light irradiation and/or other factors can be considered.

The light 210 does not need to be monochromatic light, while the light 210 may be mixed light of a plurality of discrete spectrum lights, or continuous spectrum light.

In the exemplary embodiment of the present invention, the threshold voltage will naturally change while light is being emitted. However, as will be described with respect to a sixth example later on, there may be cases in which the value of the threshold voltage will become different from that before the light irradiation even after the light irradiation has been stopped. Such behavior can also be used. It can be considered, for example, that such behavior in that the threshold voltage changes even after the light has been shut off is caused by the carriers which had been trapped inside the semiconductor or in the vicinity of the semiconductor, being rearranged due to light excitation to eventually be held in an equilibrium state that is different from before the light irradiation.

In the series of processes described above, it is desirable that the semiconductor 100 is fully shielded from light with a wavelength that is shorter than the absorption edge wavelength of the semiconductor 100. This is because the characteristics other than the threshold voltage can also be changed greatly if the semiconductor 100 is irradiated with the light with the short wavelength. Moreover, if the semiconductor 100 is irradiated with the light with the short wavelength, there might be cases in which influence of the irradiation light will remain in the semiconductor even after the irradiation light has been shut off, as with the case of light with a long wavelength. It can be considered that the behavior in that various characteristics of the semiconductor change while the semiconductor is being irradiated with the light with the short wavelength rather than the absorption edge wavelength has to do with a behavior in that a carrier density in a valence band/conduction band and an occupancy state in in-gap states greatly change because of interband transition of the carriers due to the light.

When an emission spectrum of the light source is a continuous spectrum, the wavelength condition as described above can be fulfilled by adopting an appropriate spectrum adjusting unit in combination with the light source. In order to enable spectrum adjustment of the light source, for instance, a filter of one of absorption type, reflection type and scattering type can be inserted in between the semiconductor element and the light source. Moreover, a part of the semiconductor element (e.g. a channel protection layer of the TFT) and associated members (e.g. a substrate of the TFT formed on a plastic substrate) can be made to have a filter function which enables absorption/reflection/scattering of specific light directed to the semiconductor. In a case when the light source emits monochromatic light and therefore does not emit light with the short wavelength from the beginning, it is not particularly necessary to adjust the spectrum of the light source. In this case, however, it is required that the semiconductor itself is shielded from such light with the short wavelength in light (e.g. environmental light, etc.) emitted from a light source different from the above-described light source.

There is no upper limit to the wavelength of the light with which the semiconductor 100 is to be irradiated as long as the effective advantages of the present invention are achievable. However, when the semiconductor element is an amorphous IGZO-TFT, which will be described later, the amount of the threshold voltage shift per unit time which can be obtained by the light irradiation will become smaller as the wavelength of the light becomes longer. Therefore, with respect to the amount of threshold voltage shift desired to be induced at the semiconductor element, there will be a favorable range of wavelength depending on the irradiation time and intensity of the light.

According to the present invention, the favorable range of wavelength is a length equal to the absorption edge wavelength or longer but not exceeding 660 nm.

The amount of threshold voltage shift that can be induced at the semiconductor element by the light irradiation can also change depending on a form of the semiconductor element, a defect density of the semiconductor element and operating conditions of the semiconductor element. Therefore, the amount of change in the threshold voltage needs to be measured on each occasion.

With respect to the semiconductor 100, it is desirable that the areal density of in-gap states is $10^{13}$ cm$^{-2}$eV$^{-1}$ or less. The in-gap states are localized states in the semiconductor which can generate free carriers in a conduction band or a valence band by being irradiated with light. The areal density is a density of in-gap states as converted into an interfacial density of an electric conduction region of the semiconductor element (i.e. a region ranging from a gate insulating layer to a semiconductor interface in the case where the semiconductor element is a field effect transistor such as a TFT). The areal density of the in-gap states of the TFT, for instance, can be derived as with a case of ΔNt in a first example as will be described later. Whit respect to a semiconductor having an in-gap state density larger than such value, excitation process of electrons (holes) between the in-gap state and the conduction band (valence band) will become no longer negligible, even with irradiation with photon energy that is sufficiently smaller (by about half, for example) than that of the band gap. That is, even through irradiation with light with a wavelength sufficiently longer than the absorption edge wavelength, influence similar to such in the case of the light with the short wavelength will occur, which is an undesirable situation.

It is desirable that the band gap of the semiconductor 100 is 1.55 eV or greater. With this condition, in the case where the light source 200 is to emit continuous spectrum light, there will be more options for the adjusting unit that can adjust the wavelength of the light 210 to meet each of the above-mentioned conditions with respect to the absorption edge wavelength of the semiconductor 100. For example, when the photon energy corresponding to the interband transition (absorption edge) of the free carriers in the semiconductor is in a visible light region (corresponding to a wavelength of 800 nm or less), a common high-cut filter (also referred to as low-pass filter) using absorption by organic dye can be applied. By arranging such filter in between the light source 200 and the semiconductor 100, a state in which the semiconductor is irradiated with light with a wavelength longer than the semiconductor absorption edge wavelength while substantially not being irradiated with light with a wavelength shorter than the semiconductor absorption edge wavelength can be easily achieved.

It is more desirable that the band gap of the semiconductor is 2 eV or greater. This is because it can be considered that when the semiconductor 100 is used as the channel layer of the TFT, a channel leak current at a time when the TFT is at an OFF state will depend on the band gap in the semiconductor 100. Specifically, a channel leak current Ioff (A) can be estimated by the following formula.

$$Ioff = q (ni (\mu e + \mu h)) \cdot (W/L) \cdot d \cdot Vds$$

Here, q denotes elementary charge. A value which can be denoted by ni is an intrinsic carrier density which can be represented as $ni = (\sqrt{(NcNv)}) \cdot \exp(-Eg/2 kT)$ wherein Nc denotes a state density of conduction band edge, Nv denotes a state density of valence band edge, Eg denotes a band gap, k denotes a Bolzmann coefficient, and T denotes absolute temperature. A value which can be denoted by $\mu e$ is an electron drift mobility. A value which can denoted by $\mu h$ is a hole drift mobility. A value which can be denoted by W is a channel width of the TFT. A value which can be denoted by L is a channel length of the TFT. A value which can be denoted by d is a channel layer thickness (nm). A value which can be denoted by Vds is a drain-source voltage of the TFT.

Dependency of Ioff on Eg will be estimated by the above formula. Provided that d=20 nm, W/L=4, and a material constant of monocrystalline silicon is used as all the material constants except for Eg, Ioff can be kept at about $10^{-18}$ A or less if Eg is greater than about 2 eV. In a case where potential writing/retention in a storage capacitance (electrostatic capacitance 1 pF) is to be performed through such TFT, change in the written potential due to the channel leak current can be kept at 1 V or less even after $10^6$ s (i.e. 11.5 days). This is a desirable condition because, if the TFT is used as a backplane of a display device, for example, display contents can be retained for several days.

A semiconductor which at least includes one of In, Ga, Zn and Sn can be a semiconductor that meets all the conditions described above. Therefore, in the exemplary embodiment of the present invention, it is desirable that a semiconductor which at least includes one of In, Ga, Zn and Sn is used as the semiconductor 100. For instance, the present invention is applicable to a semiconductor having component elements such as In—Ga—As, In—Ga—Al—As, Ga—As, Zn—O, Zn—S and Zn—Se.

Moreover, it is desirable that at least a part of the semiconductor 100 is amorphous. This is because a semiconductor including an amorphous portion will have better processability with respect to etching, etc. and better short range uniformity in electrical characteristic than a polycrystalline semiconductor.

An amorphous In—Ga—Zn—O (IGZO), an amorphous In—Zn—O (IZO) or an amorphous Zn—Sn—O (ZTO) can be a semiconductor that meets all the conditions described above. Accordingly, in the exemplary embodiment of the present invention, it is more desirable that a semiconductor such as an amorphous In—Ga—Zn—O (IGZO), an amorphous In—Zn—O (IZO) or an amorphous Zn—Sn—O (ZTO) is used as the semiconductor 100.

It is desirable that the light with a wavelength longer than the absorption edge wavelength of the semiconductor 100, with which the semiconductor 100 is to be irradiated, has its intensity, irradiation time or wavelength adjusted. By such adjustment, change in the threshold voltage can be induced by as much as a desired amount.

The adjustment of light with respect to intensity/irradiation time/wavelength can be achieved by an arbitrary lighting system which is provided with an appropriate spectrum adjusting unit/light intensity adjusting unit/light interruption controlling unit. As the light source, a xenon lamp, an incandescent lamp or a light-emitting diode can be used. The spectrum adjusting unit to be used can be arbitrarily selected from among diffraction grating monochromator, high-pass filter, low-pas filter and band-pass filter, depending on the emission spectrum of the light source. An ND filter or a diffuser plate can be used as the light intensity adjusting unit, although it is also possible to have the emission intensity of the light source itself adjusted. An electromagnetic shutter, etc. can be used as the light interruption controlling unit for controlling light irradiation/interruption, although it is also possible to adjust lighting/non-lighting of the light source itself. As a lighting system provided with such functions, a spectral irradiation light source as used in the first example can be used in implementing the present invention.

A sign (i.e. positive or negative direction) of the threshold voltage shift that can be caused by the light irradiation depends on the semiconductor element. For example, in a case when the semiconductor element is an amorphous IGZO-TFT being an n-channel TFT, the threshold voltage will decrease (i.e. shift in a negative direction) by irradiation with light with a wavelength longer than an absorption edge wavelength of the amorphous IGZO.

The sign of the threshold voltage shift that can be caused by the light irradiation is not particularly specified in terms of implementation of the present invention. However, it is desirable that such direction is opposite to a direction of problematic threshold voltage shift that can be caused by manufacturing process history, time-dependent change, electrical stress or thermal stress. For example, in the case of the semiconductor element being the amorphous IGZO-TFT, the threshold voltage will increase (i.e. shift in a positive direction) when a positive gate-source voltage is applied as electrical stress, meaning that the threshold voltage shift will be of the opposite sign to the threshold voltage shift to be caused by the light irradiation.

In the case of shifting the threshold voltage in the opposite direction, it is desirable that the threshold voltage shift to be caused by the light 210 will compensate for the threshold voltage shift by exactly the same amount as the amount of problematic threshold voltage shift, by adjusting the above-mentioned conditions for the light irradiation. Thereby, the semiconductor can be used without being influenced by the problematic threshold voltage shift.

Furthermore, when the threshold voltage is to be shifted in the opposite direction, and even if the threshold voltage shift caused by the light will be smaller than the problematic threshold voltage shift, that is, even if the problematic threshold voltage shift will not be able to be fully compensated for, the advantageous effects can still be obtained. For example, even if the problematic threshold voltage shift will not be able to be fully compensated for by the light irradiation, the problematic threshold voltage shift will still be restrained and the lifetime of the semiconductor may be extended. As one example, a case in which a TFT, adopting an amorphous IGZO being the semiconductor 100 as a channel layer, is driven by an external circuit and used as a switching element will be shown. As the problematic change (increase) in the threshold voltage of the semiconductor progresses to exceed a drive voltage range of the external circuit, the TFT will stop performing the switching operation and come to outlive its usefulness. For such case, by irradiating the semiconductor 100 with light in the way described above, the lifetime of the TFT can be extended to some extent even if the problematic change (increase) in the threshold voltage will not be able to be fully compensated for by the light irradiation.

Moreover, by the light irradiation, it is also possible to generate change in the threshold voltage which is larger than the problematic threshold voltage change. In this case, the larger the threshold voltage shift that can be caused by the light 210 is with respect to the problematic threshold voltage shift, the more the influence by the problematic threshold voltage shift can be decreased relatively. Specifically, it is desirable that the magnitude of the light-induced threshold voltage shift of the semiconductor element is as much as 50 or more times that of the problematic threshold voltage shift. However, if the threshold voltage shift that can be caused by the light 210 is sufficiently larger than the problematic shift, a sign (i.e. positive or negative direction) of shift does not need to be opposite to that of the problematic threshold voltage shift.

It is desirable that the irradiation with the light 210 from the light source 200 is performed during a period in which the problematic threshold voltage shift is occurring. For example, in a case where the sign of the problematic threshold voltage shift and the threshold voltage shift due to the light 210 are opposite to each other and threshold voltage shift rates of the both are about the same, the threshold voltage can be promptly adjusted by having both shifts progress simultaneously.

Meanwhile, it is also desirable that the light irradiation is performed before or after the period in which the problematic threshold voltage shift is occurring. For example, a case where the signs of the problematic threshold voltage shift and the threshold voltage shift due to the light 210 are opposite to each other and the latter threshold voltage shift progresses much faster than the former threshold voltage shift will be considered. In such case, the semiconductor will be able to be used more stably by performing the light irradiation with the light 210 intermittently for a short period of time before and after a long period of time in which the problematic threshold voltage shift slowly progresses.

If the problematic threshold voltage shift is to occur repeatedly, the light irradiation can be performed repeatedly where appropriate. For example, the light irradiation can be performed repeatedly as alternating with the occurrence of the problematic threshold voltage shift.

EXAMPLES

Now, examples of the present invention will be described. The present invention is not to be limited by the following examples.

First Example

In the present example, a TFT was fabricated first, and a treatment according to the exemplary embodiment of the present invention was applied on the TFT, upon which condition possible influence of light irradiation on the TFT was considered.

(Fabrication of Amorphous IGZO film)

To begin with, an amorphous IGZO film being a semiconductor film was manufactured to evaluate physicality of the film.

As a film-forming substrate, a glass substrate (#1737, Corning Incorporated) having been degreased was prepared. As a target material, a polycrystalline sintered compact (with a diameter of 98 mm, a thickness of 5 mm, and an electrical conductance of 0.25 $S \cdot cm^{-1}$) with an $InGaO_3$ (ZnO) composition was used. A total pressure inside a deposition chamber at film-forming was rendered 0.5 Pa by an oxygen-argon mixed gas containing 5 volume percent of oxygen. A distance between the target and the film-forming substrate was 75 mm. Film-forming was performed with a supply power of RF 200 W at a film-forming rate of 1.2 $Ås^{-1}$. A substrate temperature was not controlled particularly.

A film stacked on the substrate to a thickness of 60 nm was transparent when observed with the naked eye. X-ray was made incident on the 60-nm-stacked film at an incidence angle of 0.5 degrees with respect to a measuring surface, at which condition an X-ray diffraction measurement was performed by a thin-film method. As a result of the measurement, an obvious diffraction peak was not recognized. Accordingly, the fabricated In—Ga—Zn—O film was determined to be amorphous. As a result of an X-ray fluorescence (XRF) analysis, a metal composition ratio of the thin film was In:Ga:Zn=1:0.9:0.6. Moreover, when an electrical conductance of the thin film was measured through performing a current-voltage measurement by a coplanar type electrode pattern using a vapor-deposited laminated film of titanium and gold, the electrical conductance was measured as about $1 \times 10^{-6}$ ($S \cdot cm^{-1}$). Assuming that an electron mobility was about 5 ($cm^2 \cdot V^{-1} \cdot s^{-1}$), an electron carrier density could be estimated to be about $10^{12}$ ($cm^{-3}$).

In the above-described way, it was confirmed that the manufactured thin film of the In—Ga—Zn—O system was of amorphous oxide semiconductor, a-IGZO, which included In, Ga and Zn, and at least a part of the thin film was amorphous.

(Fabrication of TFT)

Figure 2:
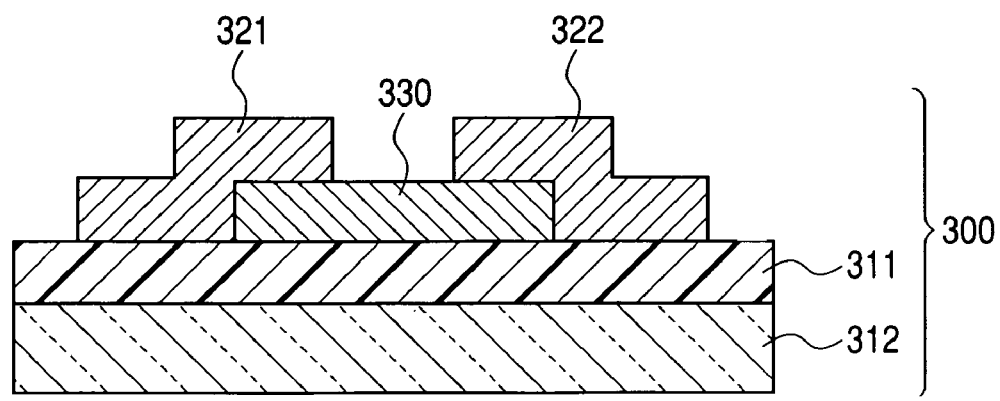
FIG. 2 is a schematic sectional view of a TFT.

Next, the TFT was fabricated by the following procedures. FIG. 2 shows a sectional view of the TFT.

To begin with, an $n^+$-silicon wafer with a thermally-oxidized silicon film (100 nm thick), of which size is 20 mm (lengthwise)×20 mm (crosswise)×0.525 mm (thick), was cleaned to be used as a substrate. Similarly to the above, an amorphous IGZO being a semiconductor was formed on the substrate by RF magnetron sputtering (under conditions in that a film forming gas was $O_2$ (5 volume percent)+Ar, a film forming pressure was 0.5 Pa, a supply power was 200 W, and a film thickness was rendered 20 nm). A substrate temperature was not particularly controlled during the sputtering film-formation. Then, the amorphous IGZO was patterned to a predetermined size by etching to become a channel layer. Then, the entire product up to this point was heated at a temperature of 300° C. for 20 minutes in the atmosphere. Then, a photoresist film was formed and patterned on the product having been heated, after which a film of titanium and gold was formed to a total thickness of 100 nm by an electronic beam evaporation technique. Then, a source electrode and a drain electrode were formed by lifting off the resist film.

Through the above procedures, a TFT 300 provided with a source electrode 321 and a drain electrode 322, where a conductive portion of the substrate was the gate electrode 312, a thermally-oxidized film was a gate insulating layer 311, the amorphous IGZO was a channel layer 330, was obtained. A channel width W was 80 µm, and a channel length L was 10 μm. With respect to this TFT, transfer characteristics (Ids-Vgs characteristics where Ids is a drain-source current, and Vgs is a gate-source voltage) was measured under a condition in that a drain-source voltage Vds was at +20 V, as a result of which obvious n channel characteristic was exhibited. A threshold voltage (Vth) and a saturated mobility (μsat) derived based on linear fit of (√Ids)-Vgs characteristic were 4.8 V and 12.9 cm$^2 \cdot$V$^{-1} \cdot$s$^{-1}$, respectively. An S value was measured as 0.6 V·dec$^{-1}$.

In this TFT, the source electrode 321 and the drain electrode 322 are apart from each other by as much as the channel length L. Therefore, by emitting the light from above in the state shown in FIG. 2, the light will reach the channel layer 330 being the semiconductor.

(Consideration of Influence of Light Irradiation on TFT)

Next, light irradiation was performed on the TFT by a method complying with the exemplary embodiment of the present invention to consider possible influence of the light irradiation on the TFT. For the light irradiation, a lighting system (spectral irradiation light source) which could lead light from a xenon lamp to a diffraction grating monochromator to emit monochromatic light on the TFT was used. An optical slit width of the monochromator was 24 nm. Density at a density variable neutral density (ND) filter as being inserted in the light path was adjusted in order to render irradiation intensity at each wavelength 0.2 mW·cm$^{-2}$. A magnetic shutter was also inserted in the light path, whereby light irradiation/non-irradiation was able to be controlled during an arbitrary period of time.

Figure 3:
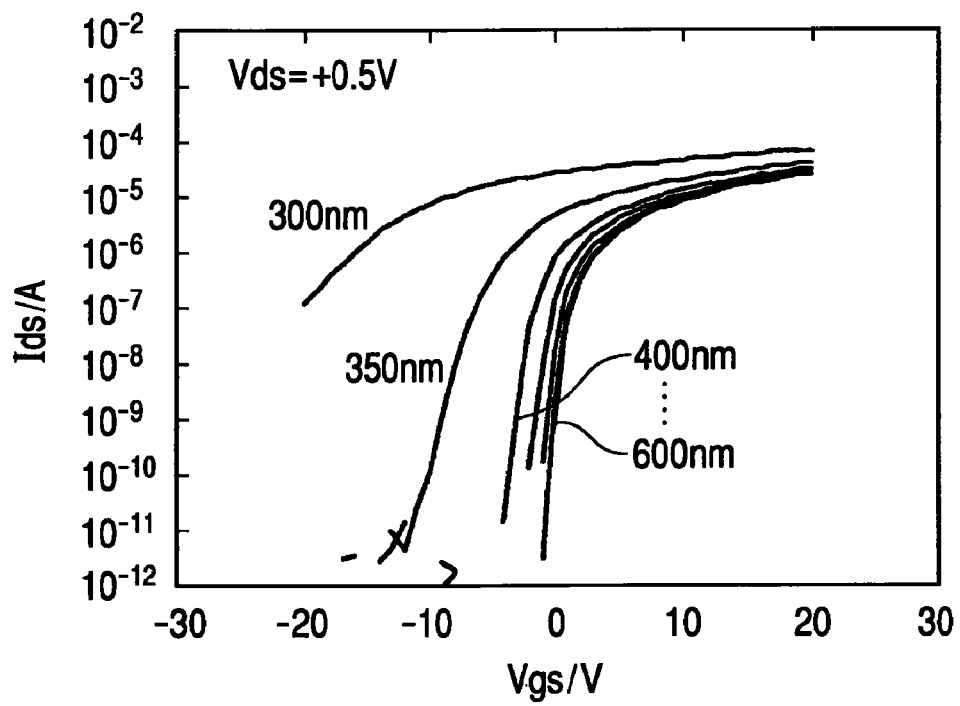
FIG. 3 is a diagram illustrating influence of light irradiation on transfer characteristics of the TFT.

First, the TFT was irradiated with monochromatic light with a wavelength of 600 nm for 100 seconds, after which transfer characteristics was measured while continuously having the light emitted on the TFT under a condition that Vds was set at +0.5 V. Next, the TFT was irradiated with monochromatic light with a wavelength of 590 nm also for 100 seconds, after which transfer characteristics was measured similarly while continuously having the light emitted on the TFT. From then on, measurements were carried out in like manner with respect to the wavelength down to 300 nm while scanning the wavelength for every 10 nm. Results of the measurements are shown in FIG. 3. For the sake of simplicity, transfer curves with respect to irradiation light wavelengths of every 50 nm, such as 600 nm, 550 nm, 500 nm, and so on are shown. As the wavelength of the irradiation light became shorter, the transfer curve moved monotonously in a negative direction of Vgs. Moreover, on the short wavelength side, shapes of the curves had changed.

Next, changes in mobility and curve shapes of the transfer curves were considered in more detail. A turn-on voltage Von (i.e. Vgs at which Ids exceeds 10$^{-10}$ A) can be considered to have a TFT characteristic index similar to that of Vth. A Von value and S value (i.e. reciprocal of a (Log (Ids))-Vgs curve gradient in the vicinity of Von) were derived for each wavelength and plotted with respect to the wavelength, whereby FIG. 4 and FIG. 5 were drawn. It can be seen that both the values of Von and S value had changed drastically from beyond a point where the irradiation light wavelength was about 360 nm. With respect to the irradiation light wavelength of 360 nm or over, change in the S value will be around a measurement error or less. Practically, down to the irradiation light wavelength of 360 nm, the shape of the transfer curve did not show so much change, while it was found out that the shape of the transfer curve could be considered as transfer characteristics as measured in a dark state being moved parallel. On the other hand, the S value increased drastically from beyond a point where the wavelength was 360 nm. This indicates that the shape of the transfer curve on the side of shorter wavelength than 360 nm would change.

The parallel movement of the transfer curve on the side of longer wavelength than 360 nm can be accounted for by release of negative fixed charges having been distributed in the semiconductor or in the vicinity of the semiconductor as trapped in the in-gap levels. On the other hand, the mechanism of change in the transfer characteristics having been noted with respect to the wavelengths shorter than 360 nm has not been defined. Presumably, it has to do with a behavior in that a carrier density in the valence band or the conduction band, and an occupancy in the in-gap states have greatly changed because of interband transition of the free carriers due to the light.

(Estimation of In-Gap Density of States)

In the following, a areal density ΔNt (cm$^{-2} \cdot$eV$^{-1}$) of the in-gap states that relates to the parallel movement of the transfer characteristics will be estimated.

Figure 4:
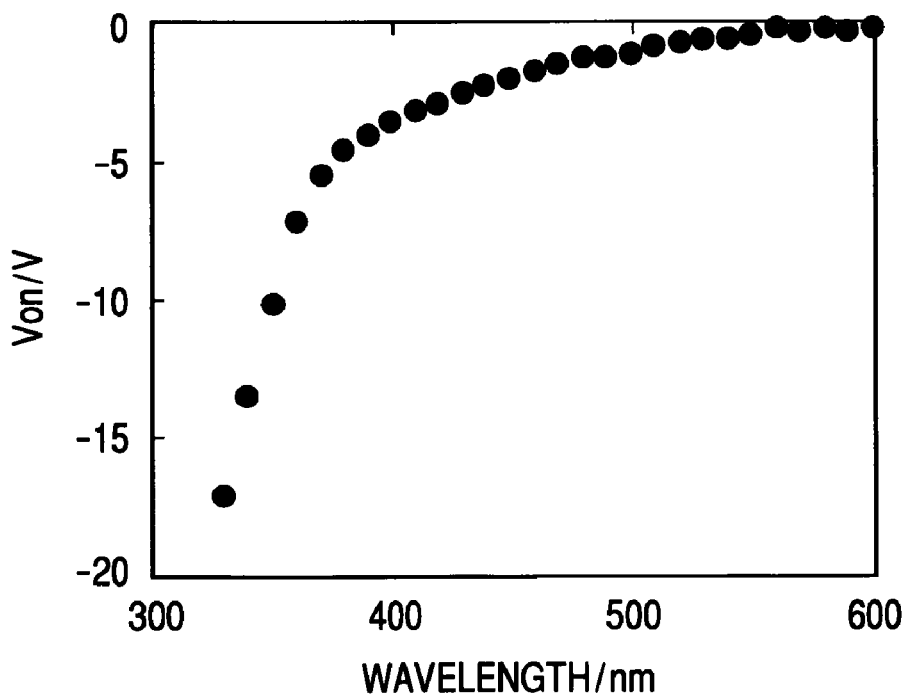
FIG. 4 is a diagram illustrating dependency of a turn-on voltage on an irradiation light wavelength, observed in the transfer characteristics of the TFT.
Figure 5:
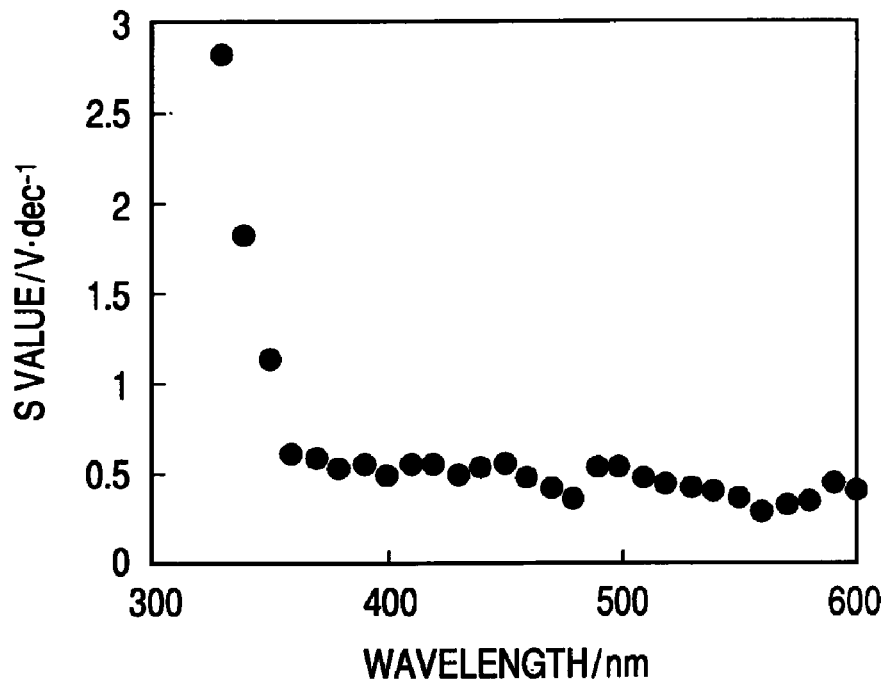
FIG. 5 is a diagram illustrating dependency of an S value on the irradiation light wavelength, observed in the transfer characteristics of the TFT.

With reference to FIG. 4, an amount of shift ΔVon of Von in a case where an irradiation light wavelength λ was moved 10 nm to the short wavelength side will be derived as a function of λ (360 nm≦λ≦600 nm). It can be considered that Von could change due to newly released fixed charges, which would not have been released due to excitation by smaller photon energy, as the release of the fixed charges occurred each time λ was changed by 10 nm. A areal density Nf (cm$^{-2}$) of the newly released fixed charges can be derived by ΔVon·gate insulating layer capacitance Ci (F·cm$^{-2}$)·elementary charge q (C), as follows.

·Nf=Ci·|ΔVon|/q

Considering a correction related to an irradiation photon energy increment Δ (hv) with respect to each λ sweep step, an areal density ΔNt (cm$^{-2} \cdot$eV$^{-1}$) of localized states having been involved in the fixed charge release can be represented as follows.

ΔNt=ΔNf/Δ (hv)=ΔNf/Δ (hc/λ)

Here, h denotes a Planck's constant, c denotes a velocity of light in vacuum. Although change in irradiation photon number due to the change of λ has been disregarded, a possible error thereby will be only about two times at the most at both ends of a λ sweep range.

Figure 6:
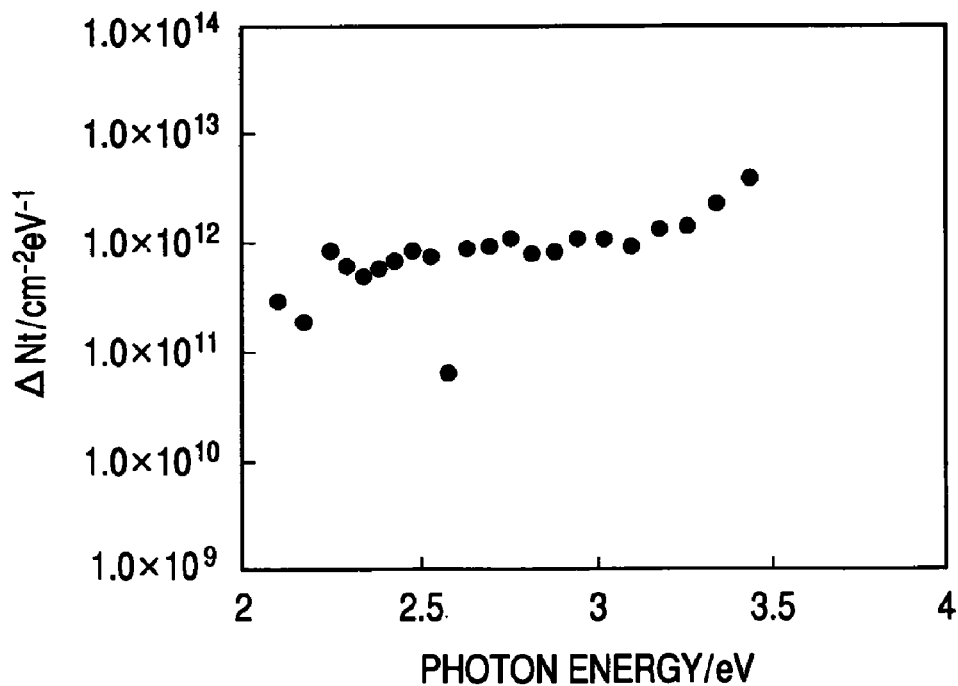
FIG. 6 is a diagram illustrating dependency of the areal density of the localized states that have involved in fixed charge release on the irradiation light wavelength in the TFT.

FIG. 6 illustrates ΔNt as plotted with respect to the irradiation photon energy. This will illustrate a state density based on energy E$_c$ in an upper end of the conduction band in the semiconductor.

Through the analysis given above, ΔNt (E) in the amorphous IGZO from energy E of E$_c$–2 (eV) to E$_c$–3.4 (eV) can be estimated as being about 10$^{13}$ cm$^{-2} \cdot$eV$^{-1}$ or less.

Although the position where the above-mentioned in-gap states exist cannot be specified yet, it is desirable, in a case where the in-gap states are distributed in the semiconductor bulk, that the density of in-gap states is evaluated by a volume density ΔNt' (cm$^{-3} \cdot$eV$^{-1}$). Such in-gap states can be estimated as follows while a semiconductor film thickness is d (cm).

ΔNt'=ΔNt/d

That is, with respect to a semiconductor film with a film thickness of 10 nm, ΔNt=10$^{13}$ (cm$^{-2} \cdot$eV$^{-1}$) will be equivalent to ΔNt'=10$^{19}$ (cm$^{-3} \cdot$eV$^{-1}$).

Second Example

In the present example, a TFT was fabricated first, and a treatment according to the exemplary embodiment of the present invention was applied on the TFT, upon which condition evaluation was carried out.

To begin with, an amorphous IGZO semiconductor was formed on an $n^+$-silicon wafer with a thermally-oxidized silicon film (100 nm thick) to a thickness of 20 nm under the same conditions as in the case of the first example. An absorption edge wavelength of such amorphous IGZO semiconductor was estimated as follows. A phase difference and an amplitude ratio with respect to reflective polarized lights p and s were derived by ultraviolet-visible spectroscopic ellipsometry. Furthermore, fundamental (inter-band-edge) absorption and tail (subband) absorption were assumed as Tauc-Lorentz type absorption and Gaussian type absorption, respectively, on the basis of which a fitting analysis of the extinction coefficient and the refractive index was performed to meet the Kramers-Kronig relation. As a result, the edge of the fundamental absorption, that is, the optical band gap of the substance, was measured as 3.5 eV (i.e. 354 nm).

Next, a TFT adopting the amorphous IGZO semiconductor as a channel layer was fabricated by the following procedures. Firstly, an amorphous IGZO to become the semiconductor was formed on the $n^+$-silicon wafer with the thermally-oxidized silicon film (100 nm thick) under the conditions as mentioned above. Then, the amorphous IGZO was patterned to a predetermined size by etching. Then, the entire product up to this point was heated at a temperature of 300° C. for 20 minutes in the atmosphere. Then, a film of titanium and gold was formed to a total thickness of 100 nm by an electronic beam evaporation technique, and a source electrode and a drain electrode patterned by lift-off were formed.

With respect to the TFT as formed in the above-described way, transfer characteristics was measured in a dark place while Vds was set at +20 V. Results of the measurements are shown by a solid line (1-1) in FIG. 7. Furthermore, TFT characteristics (Vth, μsat and S value) as derived from such results are shown in (1-1) of FIG. 8.

In addition, similar measurements and analysis were performed while having the semiconductor irradiated with monochromatic light with a wavelength longer than the semiconductor absorption edge wavelength (354 nm), i.e. a wavelength of 400 nm, and with an intensity of 0.2 mW·cm$^{-2}$. Transfer characteristics in this case are shown by a dashed line (1-2) in FIG. 7, and TFT characteristics are shown in (1-2) of FIG. 8.

With respect to the TFT characteristics in the case of light irradiation treatment being performed, Vth decreased to a considerable extent as compared to the TFT characteristics in the case of light irradiation treatment not being performed (i.e. the TFT characteristics in the dark place). Meanwhile, in the former case, a rate of change in mobility was about 6% and a rate of change in S value was at a detection sensitivity level of the measuring system or less. Furthermore, the change in the transfer characteristics could be regarded as a parallel movement with respect to Vgs in a negative direction. In this way, in the present example, the threshold voltage of the semiconductor element was able to be shifted appropriately. Meanwhile, the characteristics of the semiconductor element (such as charge mobility, S value, etc.) except for the threshold voltage were able to be kept as being equivalent to the ones before the treatment.

Third Example

In the present example, a TFT similar to the one in the second example was fabricated first, and a treatment according to the exemplary embodiment of the present invention was applied on the TFT, upon which condition evaluation was carried out. At that time, a wavelength of light in the light irradiation was made longer than the absorption edge wavelength of the semiconductor.

With respect to the TFT similar to the one in the second example, transfer characteristics was measured while having the semiconductor irradiated with monochromatic light with a wavelength longer than the semiconductor absorption edge wavelength (354 nm) of the TFT, i.e. a wavelength of 500 nm, and with an intensity of 0.2 mW·cm$^{-2}$. Results of the measurements are shown by a dotted line (1-3) in FIG. 7. Furthermore, TFT characteristics are shown in (1-3) of FIG. 8.

With respect to the TFT characteristics in the case of light irradiation treatment being performed, as compared to the TFT characteristics in the dark place as measured in the second example, only Vth decreased while mobility and S value did not change so much as with the case of the first example. On the other hand, the amount of decrease in Vth was smaller than in the case of the second example where the wavelength was 400 nm. In this way, in the present example, the threshold voltage of the semiconductor element was able to be shifted appropriately. Meanwhile, the characteristics of the semiconductor element (such as charge mobility, S value, etc.) except for the threshold voltage were able to be kept as being equivalent to the ones before the treatment.

First Comparative Example

In the present comparative example, a TFT similar to the one in the second example was fabricated first, and a treatment according to the exemplary embodiment of the present invention was applied on the TFT, upon which condition evaluation was carried out. At that time, a wavelength of light in the light irradiation was made shorter than the absorption edge wavelength of the semiconductor.

With respect to the TFT similar to the one in the second example, transfer characteristics was measured while having the semiconductor irradiated with monochromatic light with a wavelength shorter than the semiconductor absorption edge wavelength (354 nm) of the TFT, i.e. a wavelength of 320 nm, and with an intensity of 0.2 mW·cm$^{-2}$. Results of the measurements are shown by a dashed-dotted line (1-4) in FIG. 7. Furthermore, TFT characteristics are shown in (1-4) of FIG. 8.

In this case, all of Vth, mobility and S value changed to a considerable extent as compared to the TFT characteristics in the dark place as measured in the first example. That is, with the light with a wavelength shorter than the absorption edge wavelength of the semiconductor, the characteristics other than the threshold voltage were also changed undesirably to a considerable extent.

Fourth Example

The present example is about consideration on the threshold voltage shift from the perspective of manufacturing process history. First, two types of TFTs as indicated below were fabricated, and a treatment according to the exemplary embodiment of the present invention was applied on each of the TFTs, upon which condition evaluation was carried out.

(TFT-A) A TFT fabricated by the same processes as in the case of the second example.

(TFT-B) A TFT fabricated by the same processes as in the case of the second example, upon which rinsing by chemical solution was performed as one cleaning process after the fabrication processes.

Figures 7, 8, 9:
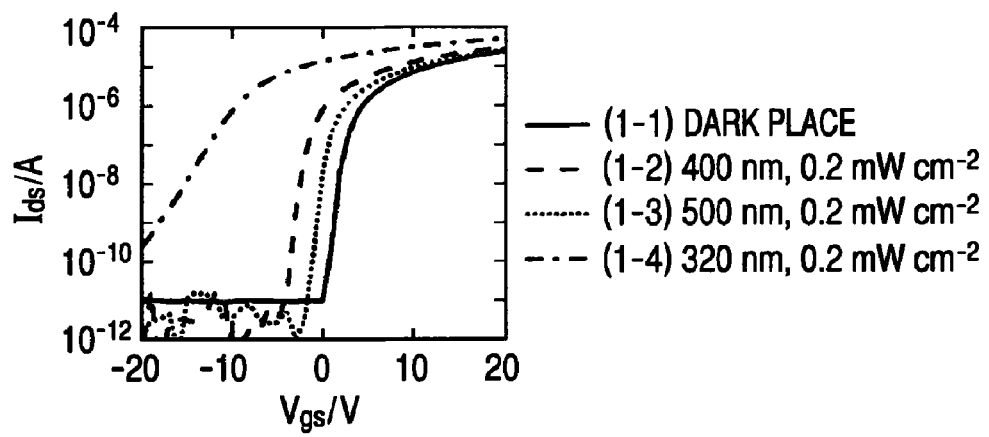
FIG. 7 is a diagram illustrating measurement results of the transfer characteristics of the TFT.
FIG. 8 is a diagram illustrating TFT characteristics under each of certain conditions.
FIG. 9 is a diagram illustrating TFT characteristics under each of certain conditions.

With respect to each TFT, transfer characteristics was measured in a dark place while Vds was set at +20 V. With respect to the TFT-B, similar measurement was performed while having the semiconductor irradiated with monochromatic light with a wavelength longer than the semiconductor absorption edge wavelength (354 nm) of the TFT-B, i.e. a wavelength of 500 nm, and with an intensity of 0.2 mW·cm$^{-2}$. TFT characteristics derived from such measurements are shown in FIG. 9. In FIG. 9 (2-2), it can be seen that the threshold voltage of the TFT-B increased drastically due to the rinsing.

As is obvious from FIG. 9, the threshold voltage of the semiconductor element was able to be shifted. Moreover, in the semiconductor element which could have threshold voltage shift caused by manufacturing process history, the threshold voltage shift was able to be restrained. Meanwhile, the characteristics of the semiconductor element (such as charge mobility, S value, etc.) except for the threshold voltage were able to be kept as being equivalent to the ones before the treatment.

In the present example, it can be considered that the rinsing process was the cause of the problematic threshold voltage shift. However, the present invention is considered effective with respect to threshold voltage shifts due to other causes. Specifically, the present invention is considered effective with respect to threshold voltage shift due to static electricity and threshold voltage shift due to uneven heating in an arbitrary heating process.

Fifth Example

In the present example, a TFT similar to the one in the second example was fabricated first, and a treatment according to the exemplary embodiment of the present invention was applied on the TFT, upon which condition evaluation was carried out. With this case, transfer characteristics was measured immediately after the fabrication of the TFT and half a year after the fabrication of the TFT, respectively.

Firstly, immediately after the fabrication of the TFT, transfer characteristics was measured in a dark place while Vds was set at +20 V. Then, with respect to this TFT, transfer characteristics was measured again in a dark place half a year after the fabrication of the TFT, after which transfer characteristics was similarly measured while having the semiconductor irradiated with monochromatic light with a wavelength longer than the semiconductor absorption edge wavelength (354 nm) of the TFT, i.e. a wavelength of 500 nm, and with an intensity of 0.2 mW·cm$^{-2}$. TFT characteristics derived from such measurements are shown in FIG. 10.

Figures 10, 11:
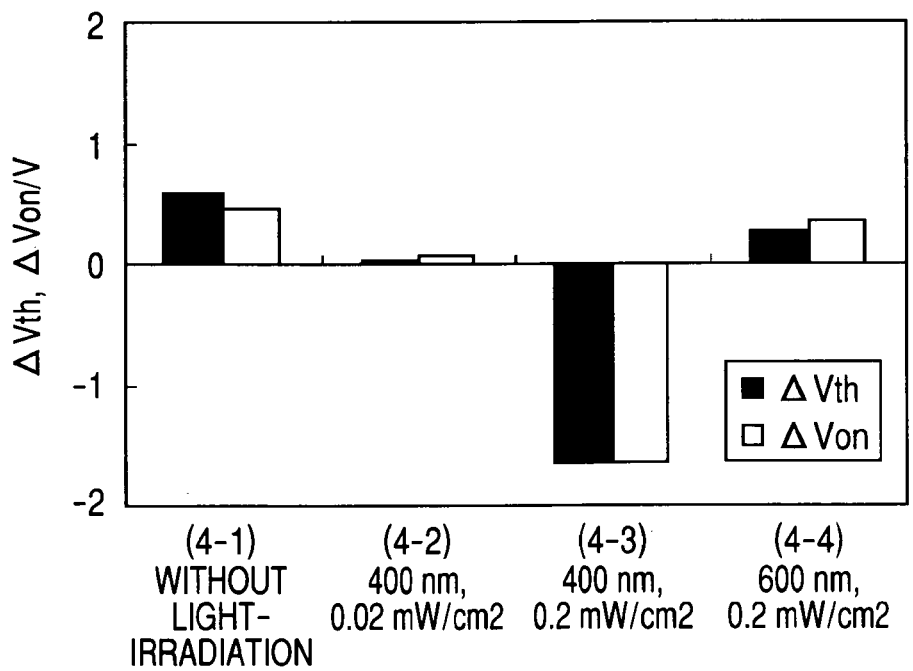
FIG. 10 is a diagram illustrating TFT characteristics under each of certain conditions.
FIG. 11 is a diagram illustrating changes in Vth and Von due to electrical stress.

As is obvious from FIG. 10, after the light irradiation, Vth decreased to a considerable extent as compared to that before the light irradiation, and eventually recovered nearly to a value which had been obtained immediately after the fabrication of the TFT. Meanwhile, a rate of change in mobility was about 6% of the initial value, and a rate of change in S value was at about a measurement error level of the measuring system or less. Furthermore, the change in the transfer characteristics could be regarded as a parallel movement with respect to Vgs in a negative direction.

In the above-described way, in the present example, the threshold voltage of the semiconductor element was able to be shifted. Moreover, in the semiconductor element which could have threshold voltage shift caused by time-dependent change, the threshold voltage shift was able to be restrained. Meanwhile, the characteristics of the semiconductor element (such as charge mobility, S value, etc.) except for the threshold voltage were able to be kept as being equivalent to the ones before the treatment.

Sixth Example

In the present example, TFTs similar to the one in the second example were fabricated first, and a treatment according to the exemplary embodiment of the present invention was applied on each TFT, upon which condition evaluation was carried out. In this case, light irradiation was performed during a period in which the threshold voltage shift due to electrical stress was occurring.

Firstly, four samples of TFTs (4-1 to 4-4) similar to the one in the first example were fabricated. With respect to each of these TFTs, transfer characteristics was measured in a dark place while Vds was set at +20 V. Then, voltages Vds of +0.1 V and Vgs of +20 V were applied to each TFT as electrical stress for 1800 seconds. In the meantime, irradiation with monochromatic light under different conditions for each TFT as indicated below was performed for 1800 seconds.

(4-1) Without Light-Irradiation
(4-2) Light irradiation with light with a wavelength of 400 nm and a light intensity of 0.02 mW/cm$^2$ being performed.
(4-3) Light irradiation with light with a wavelength of 400 nm and a light intensity of 0.2 mW/cm$^2$ being performed.
(4-4) Light irradiation with light with a wavelength of 600 nm and a light intensity of 0.2 mW/cm$^2$ being performed.

The wavelength of the light was controlled by a diffraction grating monochromator. The light intensity and irradiation time were adjusted by an ND filter and a magnetic shutter, having been inserted in the light path, respectively.

Then, the light irradiation was stopped, and transfer characteristics with respect to each TFT was measured again in a dark place while Vds was set at +20 V.

From each transfer characteristics measured before and after the electrical stress was applied, Vth, Von, μsat and S value were derived. With respect to Vth and Von among such values, respective changes ΔVth (V) and ΔVon (V) caused by the stress are shown in FIG. 11. Meanwhile, in any of the cases, changes in μsat and S value between before and after the electrical stress was applied were less than 2% and 6% of the initial values, respectively.

As is obvious from the results shown above, in the present example, the threshold voltage of the semiconductor element after the light irradiation was performed was able to be shifted. Moreover, as in the case of (4-2), with respect to the semiconductor element which could have threshold voltage shift caused by electrical stress, the threshold voltage shift was able to be compensated for. Furthermore, as in the case of (4-3), with respect to the semiconductor element which could have threshold voltage shift caused by electrical stress, influence of the threshold voltage shift was able to be made relatively small. In addition, as in the case of (4-4), with respect to the semiconductor element which could have threshold voltage shift caused by electrical stress, the threshold voltage shift was able to be restrained. When considering this case with the case of (4-3), it can be considered that more accurate compensation can be achieved by selecting an appropriate wavelength of light while maintaining the irradiation light intensity.

Meanwhile, with respect to all of the above cases, the characteristics of the semiconductor element (such as charge mobility, S value, etc.) except for the threshold voltage were able to be kept as being equivalent to the ones before the treatment.

Based on the results shown above, it can be assumed that the effects will become smaller if light with a wavelength of 660 nm or greater is used in performing the light irradiation on the TFT under the conditions in that the irradiation light intensity is 0.2 mW·cm$^{-2}$ and the irradiation time is 1800 seconds. This is because, if the above-described ΔVth and ΔVon are plotted with respect to the wavelength and extrapolated on the long wavelength side, ΔVth and ΔVon will become equal to those in the case of (4-1) where light irradiation was not performed at a wavelength of 660 nm of the irradiation light.

Second Comparative Example

In the present comparative example, a TFT similar to the one in the sixth example was fabricated first, upon which condition similar experiment was performed. In this case however, light with a wavelength of 320 nm, which is shorter than the semiconductor absorption edge wavelength (354 nm), and with a light intensity of 0.2 mW·cm$^{-2}$ was used in the light irradiation.

As a result of the experiment, change in threshold voltage was measured as considerably larger than that as measured in the sixth example (i.e. ΔVth was measured as −14.7 V and ΔVon was measured as −18.0 V). However, changes in μsat and S value increased by 24% and 51% of the initial values, respectively, which was an undesirable outcome.

Seventh Example

In the present example, as will be described below, the amount of threshold voltage shift of the semiconductor element was adjusted by adjusting light irradiation time with respect to light irradiation performed on an amorphous IGZO.

Figure 12:
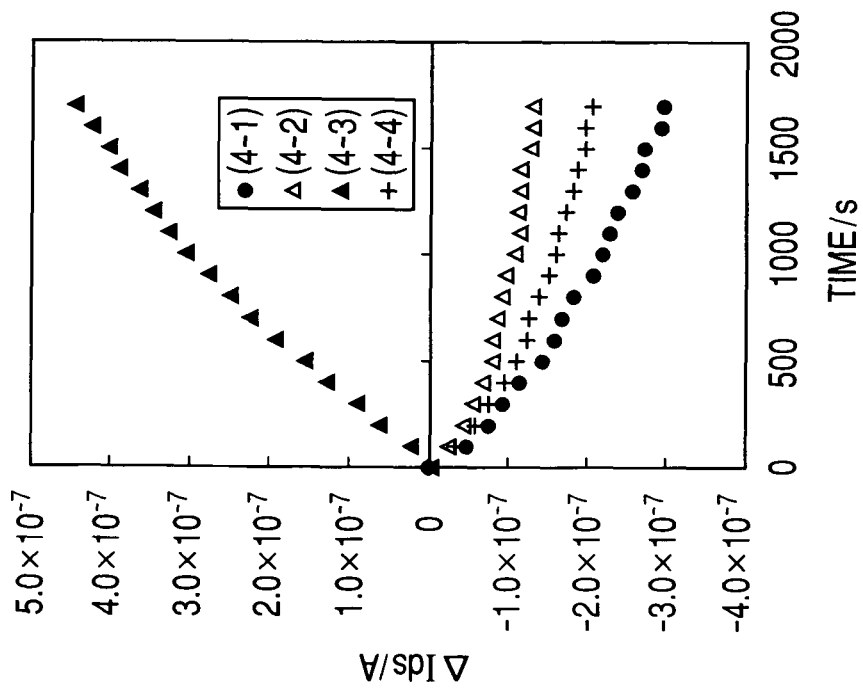
FIG. 12 is a diagram illustrating time-dependent change in Ids while electrical stress is being applied.
Figure 14A:
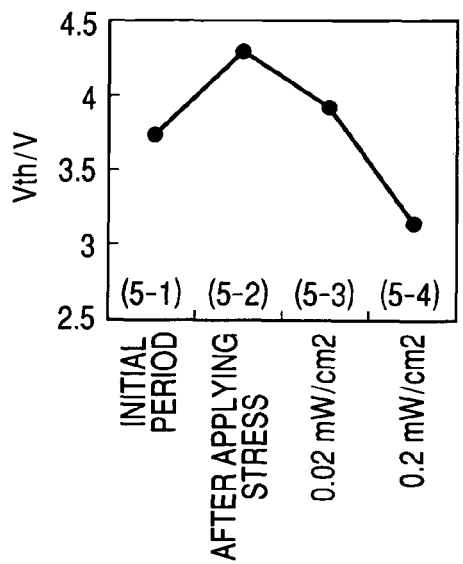
FIGS. 14A, 14B, 14C and 14D are diagrams illustrating Vth, Von, μsat and S value, respectively, derived from the transfer characteristics measured under respective certain conditions.
Figure 14B:
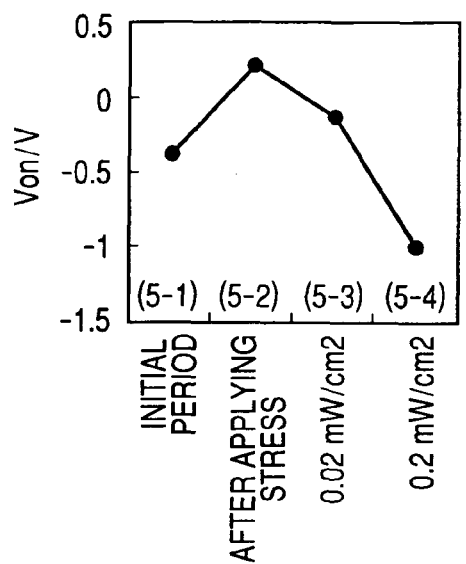
Figure 14C:
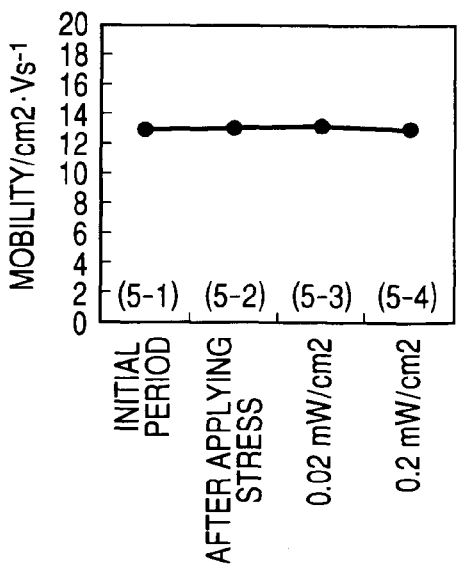
Figure 14D:
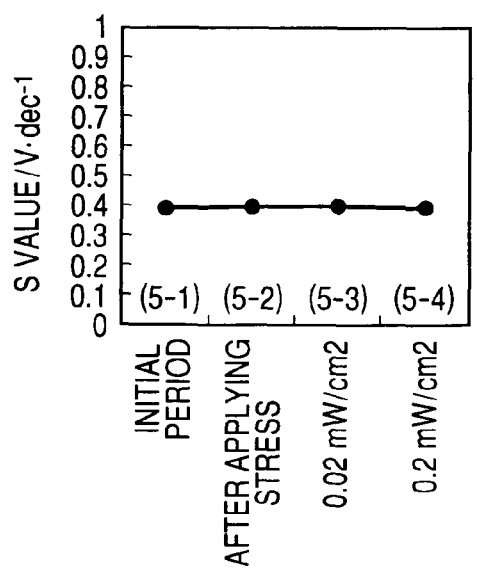

Time dependent changes ΔIds of Ids under electrical stress as measured in the sixth example are shown in FIG. 12. The value of ΔIds indicates increase/decrease with respect to the current Ids at the start time (time t=0) of the light irradiation (or voltage application).

On such basis, the threshold voltage with respect to each TFT at an arbitrary time can be obtained. Since only Vth will change while field effect mobility stays constant by the light irradiation, all the changes in Ids will depend on the changes in Vth. Accordingly, Vth at an arbitrary time can be derived from the following formula.

$$Ids=(W/L)·\mu lin·Ci·(Vgs-Vth)·Vds$$

Here, W denotes a channel width, L denotes a channel length, μlin denotes a linear mobility, and Ci denotes a gate insulating layer capacitance (F·cm$^{-2}$).

Figure 13:
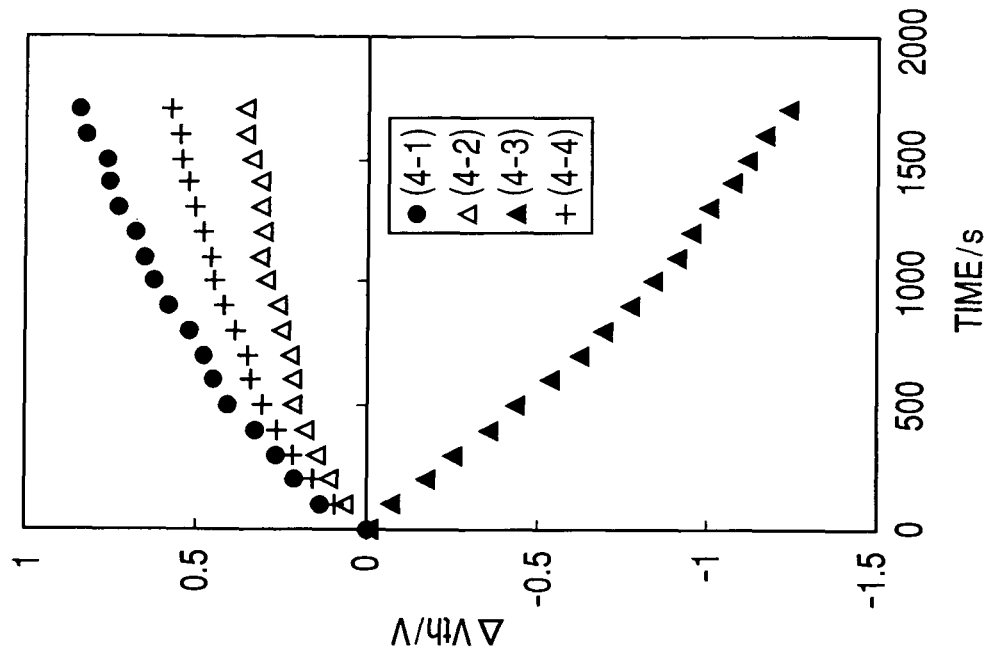
FIG. 13 is a diagram illustrating time-dependent change in Vth.

Amounts of change ΔVth in Vth from time t=0 as derived provided that μlin was equal to μsat are shown in FIG. 13. For instance, with the case of (4-3) under the condition in that Ids is to increase gradually, Vth was found decreasing with the passage of time.

In this way, by adjusting the light irradiation time, the magnitude of the threshold voltage of the semiconductor element was able to be shifted. Moreover, as in the cases of (4-2) and (4-4), with respect to the semiconductor element which could have threshold voltage shift caused by electrical stress, the threshold voltage shift was able to be restrained. Furthermore, as in the case of (4-3), with respect to the semiconductor element which could have threshold voltage shift caused by electrical stress, influence of the threshold voltage shift was able to be made relatively small.

Meanwhile, with respect to all of the above cases, the characteristics of the semiconductor element (such as charge mobility, S value, etc.) except for the threshold voltage were able to be kept as being equivalent to the ones before the treatment.

Eighth Example

In the present example, as will be described below, threshold voltage of the semiconductor element was shifted by performing light irradiation after a period of time in which the threshold voltage change due to electrical stress had occurred.

In the present example, using one sample of TFT similar to the one in the second example, transfer characteristics (5-1) to (5-4) were successively measured by the following procedures.

a) Transfer characteristics (5-1) was measured in a dark place while Vds was set at +20 V.

b) Voltages Vds of +20 V and Vgs of +20 V were applied as electrical stress for 3600 seconds in a dark place.

c) Transfer characteristics (5-2) was similarly measured in a dark place.

d) Light irradiation with monochromatic light with a wavelength of 400 nm and a light intensity of 0.02 mW·cm$^{-2}$ was performed for 100 seconds.

e) Transfer characteristics (5-3) was measured in a dark place.

f) Light irradiation with monochromatic light with a wavelength of 400 nm and a light intensity of 0.2 mW·cm$^{-2}$ was performed for 100 seconds.

g) Transfer characteristics (5-4) was measured in a dark place.

The light intensity and irradiation time were adjusted by an ND filter and a magnetic shutter, having been inserted in the light path.

Values of Vth, Von, μsat and S value as derived from respective transfer characteristics are shown in FIG. 14A to FIG. 14D. Both of Vth and Von increased due to the electrical stress, but then could be decreased by the light irradiation. Meanwhile, changes in mobility and S value were less than 2% and 4%, respectively, which were desirable figures.

In this way, the threshold voltage of the semiconductor element was able to be shifted. Moreover, as in the cases of (5-1) to (5-3), with respect to the semiconductor element which could have threshold voltage shift caused by electrical stress, the threshold voltage shift was able to be restrained. Furthermore, as in the cases of (5-1) to (5-4), with respect to the semiconductor element which could have threshold voltage shift caused by electrical stress, influence of the threshold voltage shift was able to be made relatively small. In addition, in the semiconductor element which could have threshold voltage shift caused by electrical stress, it is also possible to have the threshold voltage shift compensated for by selecting appropriate conditions from among the conditions as shown above.

Meanwhile, with respect to all of the above cases, the characteristics of the semiconductor element (such as charge mobility, S value, etc.) except for the threshold voltage were able to be kept as being equivalent to the ones before the treatment.

Ninth Example

In the present example, as will be described below, threshold voltage of the semiconductor element was shifted by performing light irradiation before a period of time in which the threshold voltage shift due to electrical stress had occurred.

With respect to a TFT similar to the one in the second example, transfer characteristics was measured in a dark place while Vds was set at +20 V. Then, light irradiation was performed with monochromatic light with a wavelength and a light intensity as indicated in (6-2) of FIG. 15 for 2000 seconds, after which transfer characteristics was similarly measured in a dark place. Then, in a dark place, voltages Vds and Vgs were applied as electrical stress under the conditions shown in (6-3) of FIG. 15, after which transfer characteristics was measured again in a dark place. TFT characteristics derived through such measurements are shown in FIG. 15.

As is obvious from FIG. 15, the threshold voltage of the semiconductor element was able to be shifted. Moreover, in the semiconductor element which could have threshold voltage shift caused by electrical stress, the threshold voltage shift was able to be restrained.

Meanwhile, the characteristics of the semiconductor element (such as charge mobility, S value, etc.) except for the threshold voltage were able to be kept as being equivalent to the ones before the treatment.

Tenth Example

In the present example, as will be described below, light irradiation was performed on a TFT in which the threshold voltage shift was caused by thermal stress.

With respect to a TFT similar to the one in the second example, transfer characteristics was measured in a dark place while Vds was set at +20 V. Then, the entire TFT was heated at a temperature of 200° C. for 15 minutes in the atmosphere, after which transfer characteristics was measured again in a dark place. Furthermore, the TFT was irradiated with monochromatic light with a wavelength and a light intensity indicated in (7-3) of FIG. 16, after which transfer characteristics was similarly measured in a dark place. TFT characteristics derived through such measurements are shown in FIG. 16.

As is obvious from FIG. 16, the threshold voltage of the semiconductor element was able to be shifted. Moreover, in the semiconductor element which could have threshold voltage shift caused by thermal stress, the threshold voltage shift was able to be restrained.

Meanwhile, the characteristics of the semiconductor element (such as charge mobility, S value, etc.) except for the threshold voltage were able to be kept as being equivalent to the ones before the treatment.

Eleventh Example

In the present example, two TFTs similar to the one in the second example were fabricated, and it was confirmed that the characteristics of these two TFTs were identical. With respect to one of the TFTs, transfer characteristics (8-1a) was measured while Vds was set at +20V. Values of Vth and ON current Ion (i.e. Ids at the time when voltages Vds of +20 V and Vgs of +10 V were applied) as derived from the measured transfer characteristics are shown in (8-1a) of FIG. 17. On the other hand, with respect to the other one of the TFTs, transfer characteristics (8-1b) was similarly measured after voltages Vds of +0.1 V and Vgs of +20 V were applied for 100 seconds as the electrical stress. Values of Vth and Ion as derived from the measured transfer characteristics are shown in (8-1b) of FIG. 17. Furthermore, light irradiation with light with a wavelength of 400 nm and with a light intensity of 0.2 mW·cm$^{-2}$ was performed on the respective TFTs, under which condition transfer characteristics (8-2a) and (8-2b) were similarly measured. Values of Vth and Ion as derived from the measured transfer characteristics are shown in (8-2a) and (8-2b) of FIG. 17, respectively. Meanwhile, changes in saturated mobility, μ sat, S value, etc. between before and after the light irradiation (i.e. between (8-1a) and (8-2a), and between (8-1b) and (8-2b)) were all less than 5%.

As is obvious from FIG. 17, threshold voltage shift of the TFT as being 50 times the amount of threshold voltage shift having been caused by the electrical stress was able to be induced by the light irradiation. At this time, a rate of change in Ion, i.e. ΔIon/Ion, between (8-2a) and (8-2b) was half as much as ΔIon/Ion between (8-1a) and (8-1b). Here, ΔIon/Ion between (8-2a) and (8-2b) can be defined as a ratio of the difference in Ion (ΔIon) between (8-2a) and (8-2b) to the value of Ion, and ΔIon/Ion between (8-1a) and (8-1b) can be defined similarly.

In this way, the rate of change in Ion induced by the electrical stress was able to be reduced to half the original value by the light irradiation.

That is, in the semiconductor element which could have threshold voltage shift caused by electrical stress, influence of the threshold voltage shift was able to be made relatively small.

Meanwhile, the characteristics of the semiconductor element (such as charge mobility, S value, etc.) except for the threshold voltage were able to be kept as being equivalent to the ones before the treatment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-056284, Mar. 6, 2008, which is hereby incorporated by reference herein in its entirety.

The invention claimed is:

1. A method of treating a semiconductor element that includes at least a semiconductor, comprising:
    irradiating the semiconductor to shift a threshold voltage of the semiconductor element, the irradiating being performed with light with a wavelength longer than an absorption edge wavelength of the semiconductor.

2. The method of treating a semiconductor element according to claim 1, wherein the semiconductor is shielded from light with a wavelength shorter than the absorption edge wavelength of the semiconductor.

3. The method of treating a semiconductor element according to claim 1, wherein the semiconductor element includes at least a gate electrode, a source electrode, a drain electrode, a channel layer, and a gate insulating layer, and wherein the semiconductor is included in the channel layer.

4. The method of treating a semiconductor element according to claim 1, wherein an areal density of in-gap states in the semiconductor is $10^{13}$ cm$^{-2}$eV$^{-1}$ or less.

5. The method of treating a semiconductor element according to claim 1, wherein a band gap in the semiconductor is 1.55 eV or greater.

6. The method of treating a semiconductor element according to claim 5, wherein the band gap is 2 eV or greater.

7. The method of treating a semiconductor element according to claim 1, wherein the semiconductor includes at least one element selected from a group consisting of In, Ga, Zn, and Sn.

8. The method of treating a semiconductor element according to claim 1, wherein at least a part of the semiconductor is amorphous.

9. The method of treating a semiconductor element according to claim 8, wherein the semiconductor is selected from a group consisting of amorphous In—Ga—Zn—O (IGZO), amorphous In—Zn—O (IZO), and amorphous Zn—Sn—O (ZTO).

10. The method of treating a semiconductor element according to claim 2, wherein the semiconductor is shielded by a filter placed between a light source and the semiconductor.

11. The method of treating a semiconductor element according to claim 1, wherein the irradiation by the light induces the shift in the threshold voltage of the semiconductor element, the shift being of an opposite sign to a threshold voltage shift caused by a manufacturing process history, a time-dependent change, an electrical stress, or a thermal stress.

12. The method of treating a semiconductor element according to claim 11, wherein an amount of the shift of the threshold voltage by the light irradiation is equal to an amount of the threshold voltage shift caused by the manufacturing process history, the time-dependent change, the electrical stress, or the thermal stress.

13. The method of treating a semiconductor element according to claim 1, wherein an amount of the shift of the threshold voltage of the semiconductor element is 50 or more times an amount of a threshold voltage shift caused by a manufacturing process history, a time-dependent change, an electrical stress, or a thermal stress.

14. The method of treating a semiconductor element according to claim 11, wherein the irradiation is performed while a threshold voltage shift due to a manufacturing process history, a time-dependent change, an electrical stress, or a thermal stress is occurring.

15. The method of treating a semiconductor element according to claim 11, wherein the irradiation is performed before or after an occurrence of a threshold voltage shift due to a manufacturing process history, a time-dependent change, an electrical stress, or a thermal stress.

* * * * *